United States Patent [19]

Mattingly, Jr.

[11] 4,149,764

[45] Apr. 17, 1979

[54] STACKED PRINTED CIRCUIT BOARD ASSEMBLY AND CONTACTS THEREFOR

[75] Inventor: William R. Mattingly, Jr., Santa Ana, Calif.

[73] Assignee: International Telephone and Telegraph Corporation, New York, N.Y.

[21] Appl. No.: 844,516

[22] Filed: Oct. 20, 1977

[51] Int. Cl.² ............................................. H01R 1/07
[52] U.S. Cl. .............................. 339/17 M; 339/49 R; 339/166 T
[58] Field of Search ............ 339/17 M, 17 LM, 18 R, 339/18 B, 47 R, 49 R, 166 R, 166 T

[56] References Cited

U.S. PATENT DOCUMENTS 2,977,562  3/1961  Benson ............................... 339/17 M
3,894,785  7/1975  Hubner et al. .................... 339/258 R

*Primary Examiner*—Gerald A. Dost
*Attorney, Agent, or Firm*—Thomas L. Peterson

[57] ABSTRACT

A stack of printed circuit boards are mechanically and electrically interconnected by a plurality of double ended contact members mounted in coaxial relationship in the boards. Each double ended contact member comprises a shrouded pin contact having a socket contact extending in a direction opposite to the pin contact. The socket contact of one double ended contact member in one board slidably engages with the shrouded pin contact of the double ended contact member in the next adjacent board. The contact members in the respective boards have cooperating standoff shoulders which space the boards apart a predetermined distance.

10 Claims, 2 Drawing Figures

STACKED PRINTED CIRCUIT BOARD ASSEMBLY AND CONTACTS THEREFOR

BACKGROUND OF THE INVENTION

The present invention relates generally to means for electrically interconnecting printed circuit boards and, more particularly, to double ended contacts for electrically and mechanically interconnecting a stack of spaced printed circuit boards.

Stacking of printed circuit boards in electronic packaging is becoming more common in order to condense the size of the package. At the present time, it is common to utilize straight copper posts which extend through plated-through holes in stacked printed circuit boards for electrically interconnecting the printed circuitry on the boards. Sometimes metal spacers surrounding the rods are used for maintaining the boards in a predetermined spaced relationship. Reflow solder techniques are utilized to electrically connect the copper posts in the plated-through holes. One form of stacked printed circuit board assembly of the aforementioned type is disclosed in U.S. Pat. No. 2,913,634. Such assemblies have the disadvantage that in order to repair any board within the stack, all the copper posts must be removed from the stack of boards in order to remove the board which requires repair. This requires removal of all the solder joints between the copper posts and the printed circuit boards, which is time consuming and costly. Furthermore, precise board spacing is difficult to maintain, and tight manufacturing tolerances must be maintained in order to avoid misalignment of the plated-through holes in the boards which receive the copper posts.

U.S. Pat. No. 3,568,001 discloses another form of stacked printed board assembly utilizing elongated posts or contacts which extend through socket contacts mounted in the boards. The entire printed circuit board assembly must be disassembled in order to repair any one of the boards. Other stacked board assemblies are disclosed in U.S. Pat. Nos. 3,028,573; 3,205,469; 3,270,251; and 3,904,934. The stacked board assemblies disclosed in these patents require spacers in order to maintain the spacing between the boards, which adds to the complexity and cost of the assemblies.

It is the object of the present invention to provide an improved stacked printed board assembly in which the boards are easily separated for repair, and do not require separate spacers for maintaining the spacial relationship between the boards. Another object of the invention is to provide a novel double ended pin and socket contact for a stacked printed circuit board assembly which allows the boards to be electrically interconnected and mechanically spaced apart without maintaining tight manufacturing tolerances on the boards.

SUMMARY OF THE INVENTION

According to a principal aspect of the present invention, there is provided a pin and socket contact member comprising a shrouded pin contact having a socket contact thereon which extends in a direction opposite to the pin contact.

According to another aspect of the invention, there is provided a stacked printed circuit board assembly wherein a plurality of the aforementioned pin and socket contact members are mounted in the boards and interengage each other in coaxial relationship to electrically and mechanically interconnect the boards. The mating contacting portions of the contacts have a sliding engagement so that the boards may be easily assembled and disassembled when required for repair of any individual board in the stack.

DESCRIPTION OF THE PREFERRED EMBODIMENT

Figure 1:
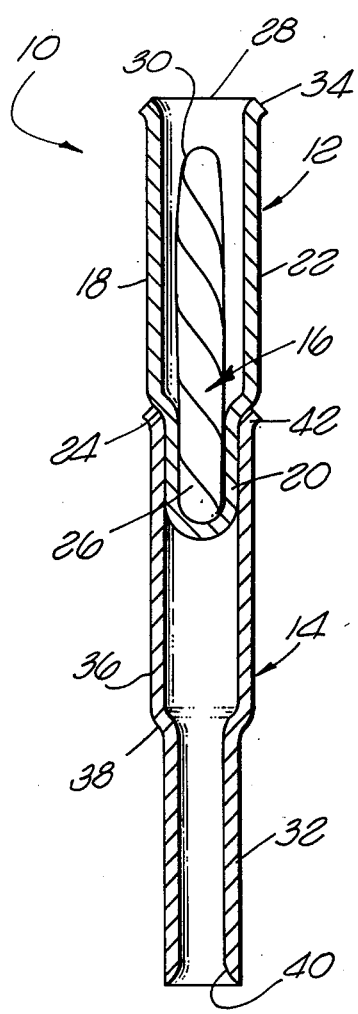
FIG. 1 is a longitudinal sectional view through a pin and socket contact member in accordance with the present invention.

Referring now to FIG. 1 of the drawing in detail, there is illustrated the pin and socket contact member of the present invention, generally designated 10. The contact member 10 comprises a shrouded pin contact 12 and a tubular socket contact 14 which extend in opposite directions relative to each other. The shrouded pin contact includes a pin contact 16 and a tubular receptacle sleeve 18 which surrounds the pin contact. The pin contact is illustrated as comprising a plurality of twisted or spiral wires, but may consist of a plurality of looped or double back formed wires or simply a straight solid pin, such as disclosed in U.S. Pat. No. 3,277,422. The diameter of the rear portion 20 of the sleeve is less than the diameter of the forward portion 22 thereof defining therebetween a rearwardly facing annular shoulder 24. The rear end 26 of the pin contact 16 is fixedly mounted in the rear portion 20 of sleeve 18, such as by crimping the sleeve about the pin contact. The front end 28 of the sleeve 18 extends beyond the front mating end 30 of the pin contact providing protective shroud for the contact. As seen in the drawing, the forward portion 22 of the sleeve has a sufficiently large diameter that it is spaced from the front mating end 30 of the pin contact. The internal diameter of the forward portion 22 of the sleeve 18 is dimensioned to slidably receive the front mating end 32 of a second tubular socket contact 14 whereby the pin contact 16 will become slidably engaged within said front mating end of the socket contact.

The forward end 28 of sleeve 18 is flared outwardly to provide a forwardly facing annular shoulder 34 and a lead-in chamfer for facilitating insertion of a socket contact into the sleeve.

The front mating end 32 of the socket contact 14 has a diameter less than the rear mounting end 36 thereof defining an outwardly extending forwardly facing annular shoulder 38 therebetween. The shoulder 38 is adapted to be engaged by the forwardly facing shoulder 34 of a mating shrouded pin contact 12. A lead-in chamfer 40 is formed on the interior of the forward end of the socket contact 14 for facilitating insertion of a second pin contact thereinto. The rear end of the socket contact 14 is flared outwardly to provide a rearwardly facing annular shoulder 42 which abuts the shoulder 24 on the sleeve 18. Preferably, the rear portion 20 of the sleeve 18 is press fit into the rear mounting end 36 of the socket contact 14 to provide double ended unitary contact assembly.

Figure 2:
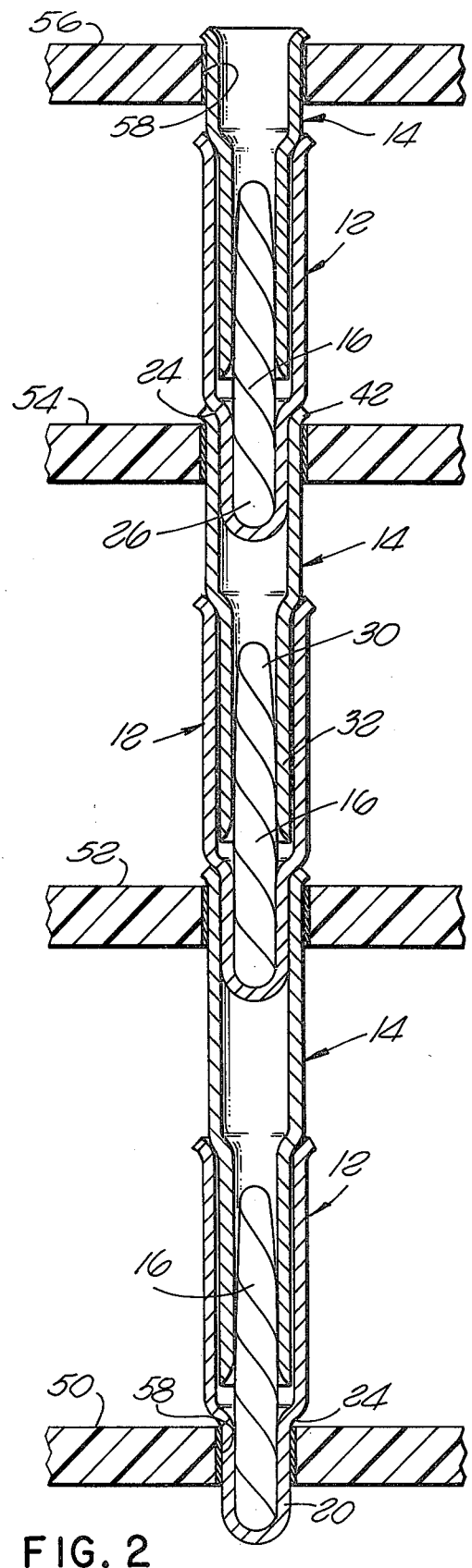
FIG. 2 is a vertical sectional view through a stack of printed circuit boards electrically and mechanically interconnected by a plurality of pin and socket contact members as illustrated in FIG. 1.

Reference is now made to FIG. 2 which illustrates a stack of four parallel spaced printed circuit boards 50, 52, 54 and 56 each having a plated-through hole 58 therein coaxially aligned with the holes in the other boards. Since the board 50 is the bottom board of the stack, only a shrouded pin contact 12 is mounted in the plated-through hole 58 in the board. More specifically, the rear portion 20 of the receptacle sleeve 18 is mounted in the hole with the shoulder 24 of the sleeve nearly abutting the upper surface of the board. Pin and socket contact members 10 are mounted in the plated through holes in the intermediate boards 52 and 54. The rear mounting ends 36 of the socket contacts 14 of members 10 are mounted in the plated-through holes with the outwardly flared ends 42 thereof abutting the upper surfaces of the boards.

In the upper board 56, there is illustrated only a socket contact 14 mounted in the plated-through hole 38, the shrouded pin contact not being necessary since there is no additonal socket contact above board 56 for mating therewith.

In each case, the contacts may be mounted in the boards by either a press fit, or by sliding fit and reflow soldering of the plated-through holes.

When the contacts 10 and 12 in the boards 52 and 50, respectively, are interengaged, the front mating end 32 of socket contact 14 in board 52 slides into the receptacle sleeve 18 of the shrouded pin contact 12 in board 50 and slidably receives the pin contact 16 therein to electrically interconnect the two boards. Also, when the contact members are fully mated, the shoulder 34 on the forward end of sleeve 18 of contact 12 in board 50 abuts the shoulder 38 on the contact 10 in board 52. Thus, the two shoulders form "stand-off" shoulders which cooperate to space the boards 50 and 52 apart a predetermined distance. Further, the cooperating stand-off shoulders on the mating contact member in the boards achieve accurate spacing of the boards without the necessity of additional spacer elements as used in prior stacked printed circuit board assemblies.

The socket contact 14 of contact member 10 in board 54 engages the shrouded pin contact 12 of contact member 10 in board 52 in the same manner as just described, and the socket contact 14 in board 56 cooperates with the shrouded pin contact 12 of the contact member 10 in board 54 in a like manner, with the stand-off shoulder in the respective contact members cooperating to space the boards apart.

While only a single series of contact members 10 is shown in the boards in FIG. 2, it will be appreciated that three such series would be required to provide a stable mounting of the boards in parallel relationship and such an arrangement is preferred. Normally, substantially more than three series of contacts are used in the boards.

It is noted that the rear mounting ends 36 of the socket contacts illustrated in FIG. 2 have different lengths so that the spacing between the adjacent boards differs. Preferably, the shrouded pin contacts 12 of the members 10 are of standard dimensions for all spaced boards, while the socket contacts 14 of the members may have varying lengths depending upon the board spacing desired. The socket contact is very inexpensive to produce in quantity since it is in the form of an eyelet. Therefore, by simply altering the lengths of the socket contacts, variable spacing of the boards may be achieved.

It will be appreciated that any number of circuit boards can be stacked utilizing the interconnect system of the present invention with a minimum of contact resistance. Further, since the contact members of the various boards have only a sliding engagement therebetween, the stack of boards may be easily disassembled for repair of any one of the boards. Further, because of the lead-in chamfers provided on the ends of the shrouded pin contact and socket contact of each member 10, the contact members may be easily interconnected without requiring close manufacturing tolerances for the boards.

What is claimed is:

1. A pin and socket contact member comprising:
   a shrouded pin contact having a front mating end and a rear end;
   a socket contact having a front mating end and a rear mounting end adapted to be mounted in a printed circuit board;
   said rear end of said pin contact being fixedly mounted in said rear mounting end of said socket contact;
   said shrouded pin contact including a receptacle sleeve surrounding said front mating end of said pin contact and being fixed to said rear mounting end of said socket contact; and
   said front mating end of said socket contact being dimensioned to slide into the receptacle sleeve of another one of said shrouded pin contacts and slidably receive therein the pin of said other contact in electrical engaging relationship therewith.

2. A pin and socket contact member as set forth in claim 1 wherein:
   said receptacle sleeve embodies an outwardly extending forwardly facing shoulder thereon; and
   said socket contact embodies an outwardly extending forwardly facing shoulder thereon behind said front mating end thereof.

3. A pin and socket contact member as set forth in claim 2 wherein:
   said shoulder of said receptacle sleeve is formed on the front end of said sleeve.

4. A pin and socket contact member as set forth in claim 1 wherein:
   said front mating end of said socket contact has a diameter less than that of said rear mounting end thereof providing a forwardly facing shoulder; and
   the forward portion of said receptacle sleeve is flared outwardly to form a forwardly facing shoulder engageable with the forwardly facing shoulder on another one of said socket contacts.

5. A pin and socket contact member as set forth in claim 4 wherein:
   the rear portion of said sleeve has a diameter less than that of the forward portion of said sleeve providing a rearwardly facing annular shoulder therebetween;
   the rear mounting end of said socket contact is flared outwardly to provide a rearwardly facing annular shoulder;
   said rear portion of said sleeve being mounted in said rear mounting end of said socket contact with said rearwardly facing shoulder on said sleeve engaging said rearwardly facing shoulder on said socket contact; and
   said rear end of said pin contact is mounted in said rear portion of said sleeve.

6. A printed circuit board assembly comprising:
   first and second printed circuit boards mounted in generally parallel spaced relationship;
   a shrouded pin contact mounted in said first board extending toward said second board;

a socket contact mounted in said second board extending toward said first board and slidably engaged with said shrouded pin contact; and said shrouded pin contact and said socket contact embodying cooperating stand-off shoulders spacing said boards apart a predetermined distance.

7. A printed circuit board assembly as set forth in claim 6 including:

a third printed circuit board generally parallel to and spaced from said second board on the side thereof opposite to said first board;

a second shrouded pin contact fixed to said socket contact and extending coaxially therewith toward said third board;

a second socket contact mounted in said third board extending toward said second board and slidably engaged with said second shrouded pin contact; and said second shrouded pin contact and said second socket contact embodying cooperating stand-off shoulders spacing said second and third boards apart a predetermined distance.

8. A printed circuit board assembly as set forth in claim 7 wherein:

said socket contacts have different lengths whereby the predetermined distances between said boards differ.

9. A printed circuit board assembly comprising:

a plurality of printed circuit boards in generally parallel spaced relationship;

a pin and socket contact member mounted in each board in coaxial alignment with each other;

each said member comprising a shrouded pin contact having a socket contact thereon extending in a direction opposite to said pin contact, said shrouded pin contact including a receptacle sleeve surrounding said pin contact; and the socket contact of the member in each said board being dimensioned to slide into the receptacle sleeve of the member in the next adjacent board and slidably receive therein the pin of said member in said next adjacent board in electrical engaging relationship therewith.

10. A printed circuit board assembly as set forth in claim 9 wherein:

the mating shrouded pin contacts and socket contacts between said boards embody cooperating stand-off shoulders spacing said boards apart a predetermined distance.

* * * * *